United States Patent
Yoshida et al.

(10) Patent No.: US 11,784,000 B2
(45) Date of Patent: Oct. 10, 2023

(54) CAPACITOR AND METHOD FOR PRODUCING SAME

(71) Applicant: Panasonic Intellectual Property Management Co., Ltd., Osaka (JP)

(72) Inventors: Kazushi Yoshida, Osaka (JP); Yosuke Hagihara, Osaka (JP); Takumi Taura, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 140 days.

(21) Appl. No.: 17/472,490

(22) Filed: Sep. 10, 2021

(65) Prior Publication Data

US 2021/0407734 A1    Dec. 30, 2021

Related U.S. Application Data

(63) Continuation of application No. PCT/JP2020/010054, filed on Mar. 9, 2020.

(30) Foreign Application Priority Data

Mar. 13, 2019    (JP) .................................. 2019-046508

(51) Int. Cl.
    *H01G 4/008*        (2006.01)
(52) U.S. Cl.
    CPC .................... *H01G 4/008* (2013.01)
(58) Field of Classification Search
    CPC ........... H01G 4/008; H01G 4/33; H01L 27/04
    See application file for complete search history.

(56) References Cited

U.S. PATENT DOCUMENTS

| | | | |
|---|---|---|---|
| 5,372,962 A | 12/1994 | Hirota et al. | |
| 5,739,565 A | 4/1998 | Nakamura et al. | |
| 2008/0291601 A1 | 11/2008 | Roozeboom et al. | |
| 2014/0374879 A1* | 12/2014 | Chen | H01L 22/20 257/532 |

(Continued)

FOREIGN PATENT DOCUMENTS

| | | |
|---|---|---|
| JP | H05-160342 A | 6/1993 |
| JP | H06-13547 A | 1/1994 |

(Continued)

OTHER PUBLICATIONS

International Search Report and Written Opinion issued in International Patent Application No. PCT/JP2020/010054, dated Jun. 2, 2020 with partial English translation.

*Primary Examiner* — Nathan Milakovich
(74) *Attorney, Agent, or Firm* — McDermott Will & Emery LLP

(57) ABSTRACT

A capacitor includes a silicon substrate, a conductor layer, and a dielectric layer. The silicon substrate has a principal surface including a capacitance generation region and a non-capacitance generation region. The silicon substrate has a porous part provided in a thickness direction in the capacitance generation region. The conductor layer has a surface layer part at least covering part of a surface of the capacitance generation region and a filling part filled in at least part of fine pores of the porous part. The dielectric layer is provided between an inner surface of the fine pores and the filling part.

16 Claims, 10 Drawing Sheets

(56) References Cited

U.S. PATENT DOCUMENTS

| | | | |
|---|---|---|---|
| 2015/0145104 A1* | 5/2015 | Bauer | H01L 21/283 438/381 |
| 2018/0277622 A1* | 9/2018 | Nishiyama | H01L 28/90 |
| 2023/0178627 A1* | 6/2023 | Yoshida | H01L 29/0665 257/301 |

FOREIGN PATENT DOCUMENTS

| | | | | |
|---|---|---|---|---|
| JP | 2001-523050 A | 11/2001 | | |
| JP | 2009-059990 A | 3/2009 | | |
| JP | 2009-515353 A | 4/2009 | | |
| JP | 2017-098499 A | 6/2017 | | |
| WO | WO-2012078213 A1 * | 6/2012 | | H01G 4/06 |

* cited by examiner

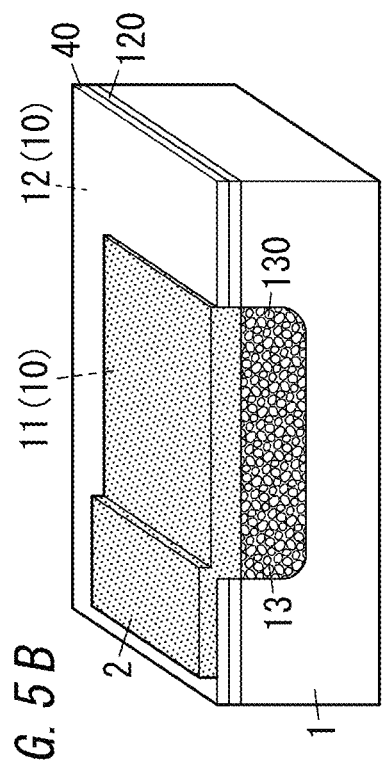
FIG. 5A
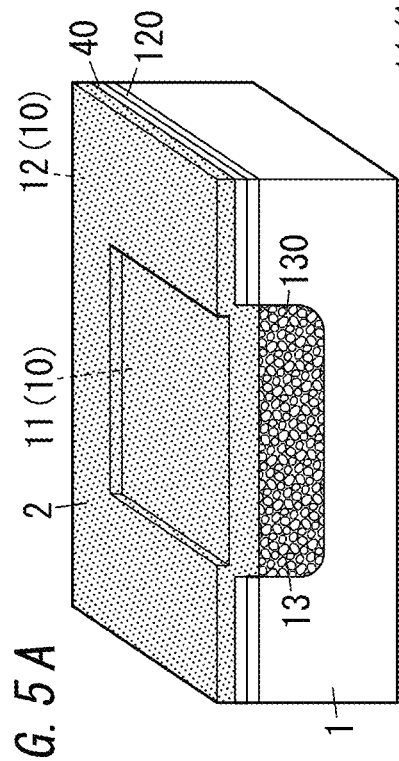
FIG. 5B
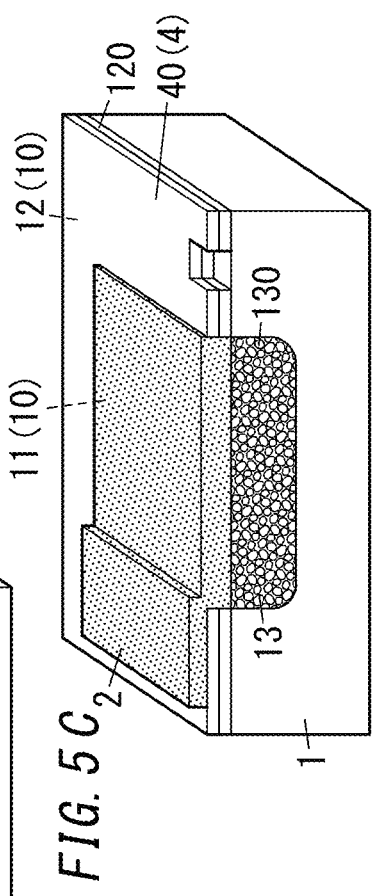
FIG. 5C₂
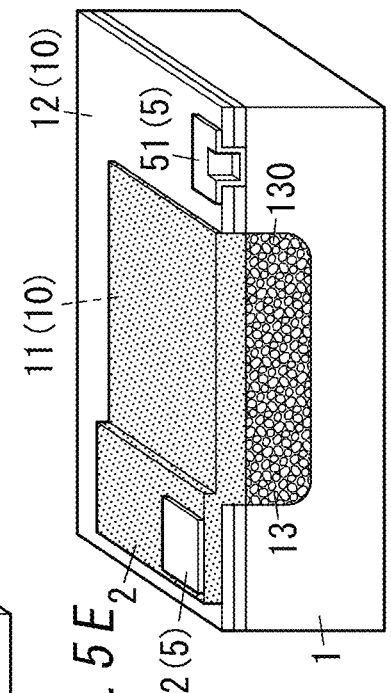
FIG. 5E₂
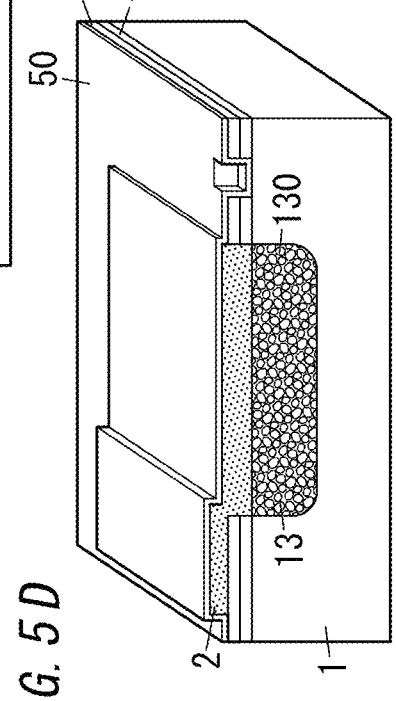
FIG. 5D

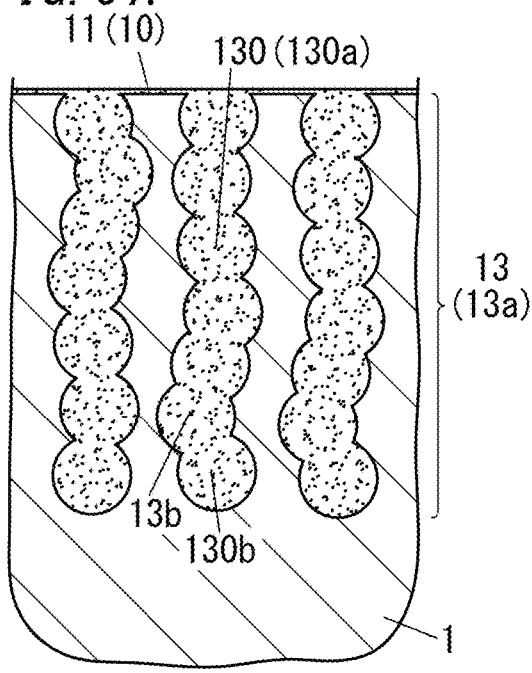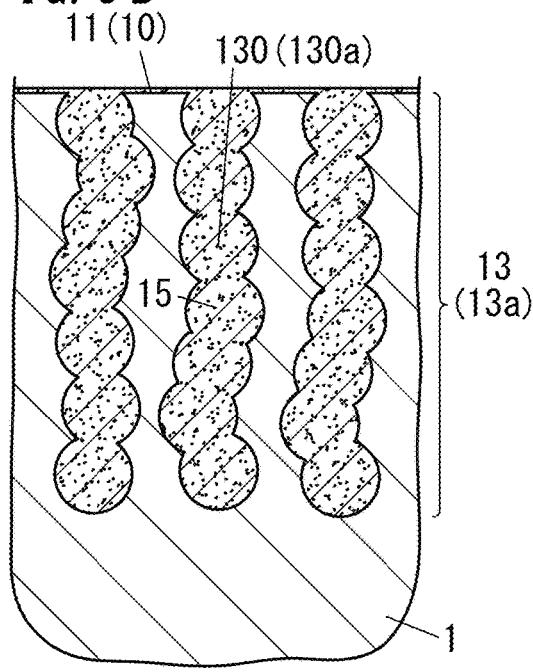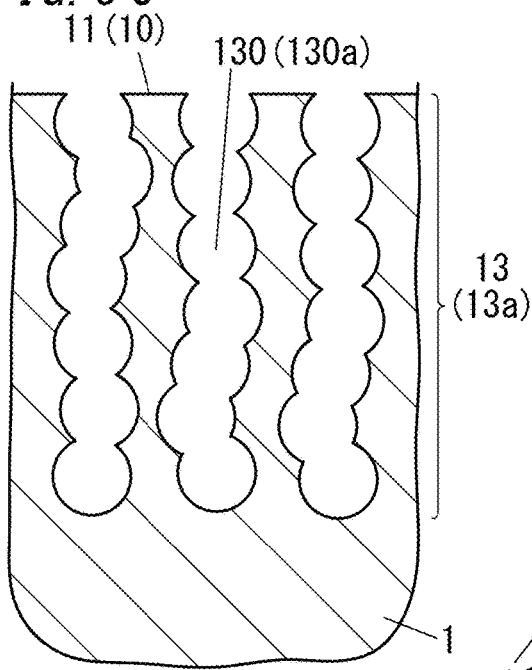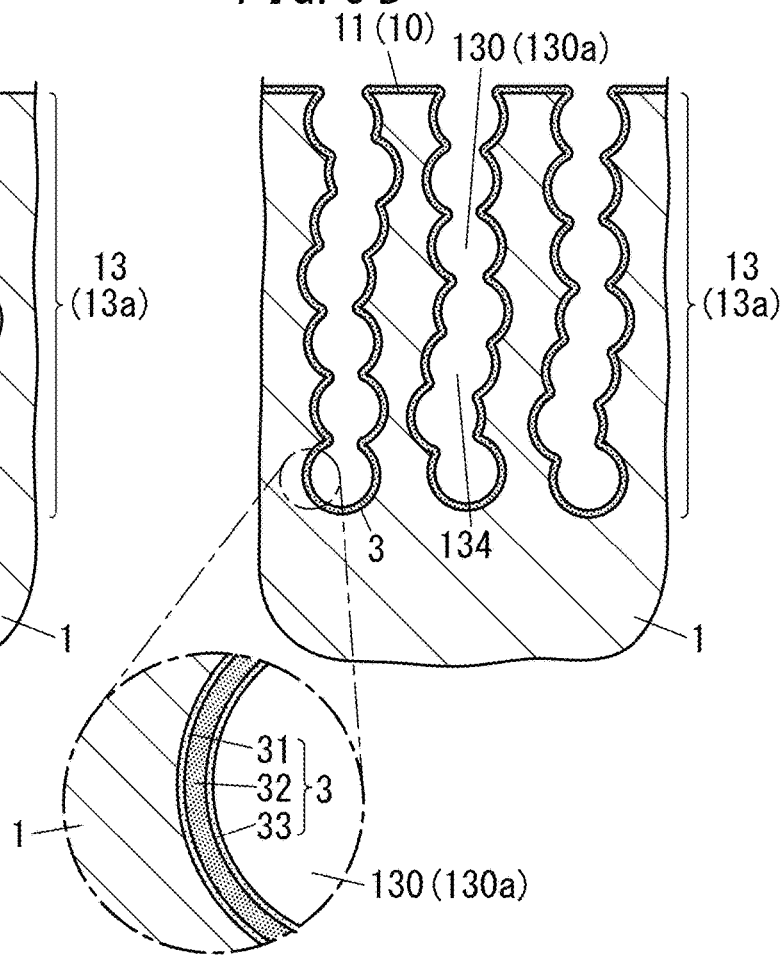

CAPACITOR AND METHOD FOR PRODUCING SAME

CROSS-REFERENCE TO RELATED APPLICATION

The present application is a Bypass Continuation of International Application No. PCT/JP2020/010054 filed on Mar. 9, 2020, which is based upon and claims the benefit of priority to Japanese Patent Application No. 2019-046508, filed on Mar. 13, 2019, the entire contents of both applications are incorporated herein by reference.

TECHNICAL FIELD

The present disclosure relates to capacitors and methods for producing the capacitors. The present disclosure specifically relates to a capacitor including a silicon substrate, a dielectric layer, and a conductor layer and a method for producing the capacitor.

BACKGROUND ART

JP 2009-515353 A discloses an electronic device including a trench capacitor formed by alternately providing a conductive layer and a dielectric layer in a trench formed in a substrate by a method such as etching. In the electronic device of JP 2009-515353 A, the substrate is provided with a large number of trench capacitors to increase a capacitance value (electrostatic capacitance).

In the electronic device of JP 2009-515353 A, however, the electrostatic capacitance cannot satisfactorily be increased in some cases.

SUMMARY

An object of the present disclosure is to provide a capacitor having electrostatic capacitance which is easily increased and to provide a method for producing the capacitor.

A capacitor according to an aspect of the present disclosure includes a silicon substrate, a conductor layer, and a dielectric layer. The silicon substrate has a principal surface including a capacitance generation region and a non-capacitance generation region, and the silicon substrate has a porous part provided in a thickness direction in the capacitance generation region. The conductor layer has a surface layer part at least covering part of a surface of the capacitance generation region and a filling part filled in at least part of fine pores of the porous part. The dielectric layer is provided between an inner surface of the fine pores and the filling part.

A method for producing a capacitor according to an aspect of the present disclosure includes a step of providing a masking layer on a non-capacitance generation region of a silicon substrate having a principal surface including a capacitance generation region and the non-capacitance generation region. The method for producing the capacitor further includes a step of forming, by an anode oxidation process, a porous part in the capacitance generation region in a thickness direction of the silicon substrate by forming fine pores in the capacitance generation region which is not covered with the masking layer. The method for producing the capacitor further includes a step of forming a dielectric layer on an inner surface of the fine pores. The method for producing the capacitor further includes a step of forming a conductor layer including a filling part filled in at least part of the fine pores and a surface layer part at least covering part of a surface of the capacitance generation region.

BRIEF DESCRIPTION OF THE DRAWINGS

The figures depict one or more implementation in accordance with the present teaching, by way of example only, not by way of limitations. In the figures, like reference numerals refer to the same or similar elements.

FIG. 5A to FIG. 5E are perspective views schematically illustrating the example of the method for producing the capacitor according to the embodiment of the present disclosure;

FIG. 6A is an enlarged view illustrating a main part of a silicon substrate after an anode oxidation process;

FIG. 6B is an enlarged view illustrating the main part of the silicon substrate after a thermal oxidation process;

FIG. 6C is an enlarged view illustrating the main part of the silicon substrate after oxide removal;

FIG. 6D is an enlarged view illustrating the main part of the silicon substrate after dielectric layer formation;

DETAILED DESCRIPTION

1. First Embodiment (1) Schema

Figure 1A:
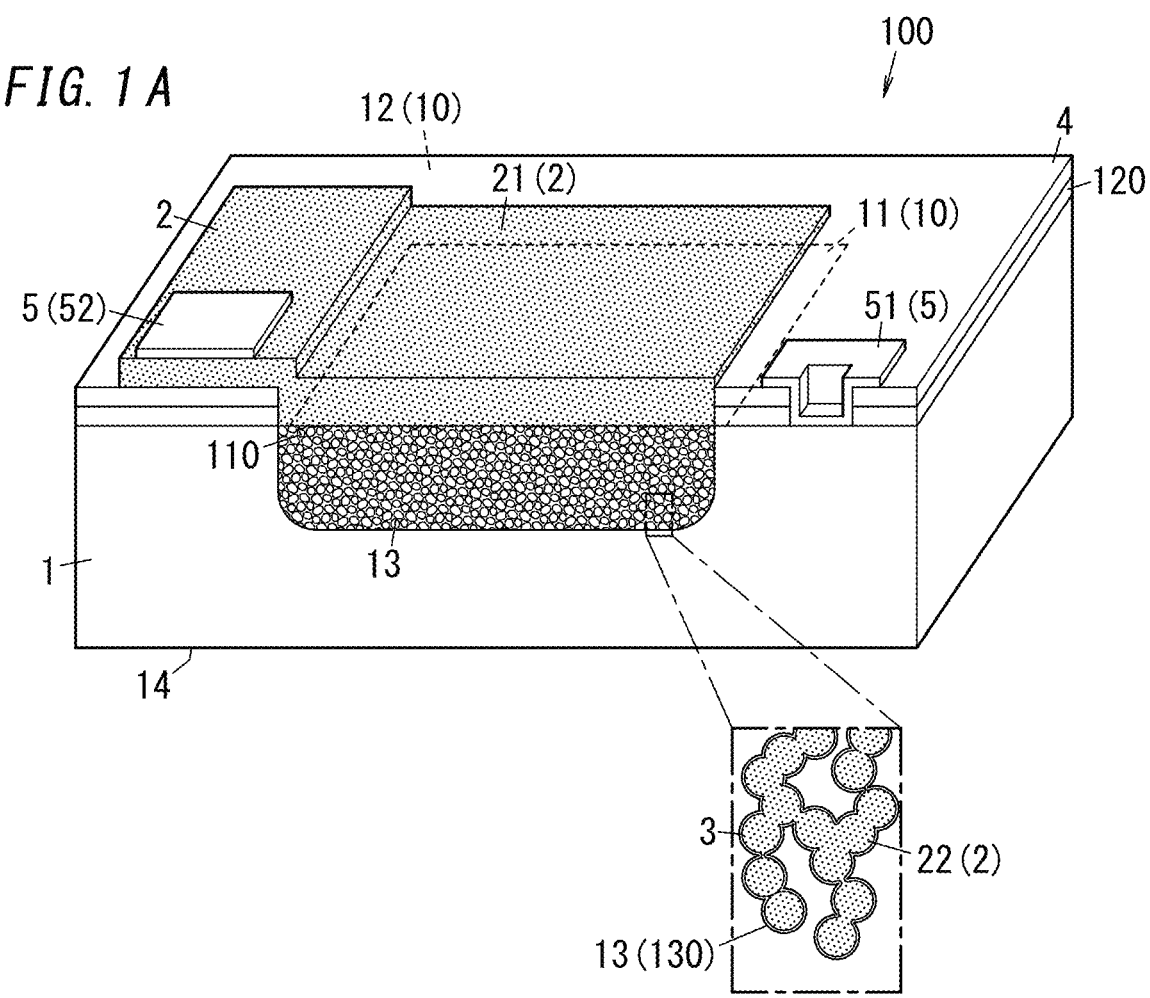
FIG. 1A is a perspective view schematically illustrating an example of a capacitor according to an embodiment of the present disclosure.
Figure 1B:
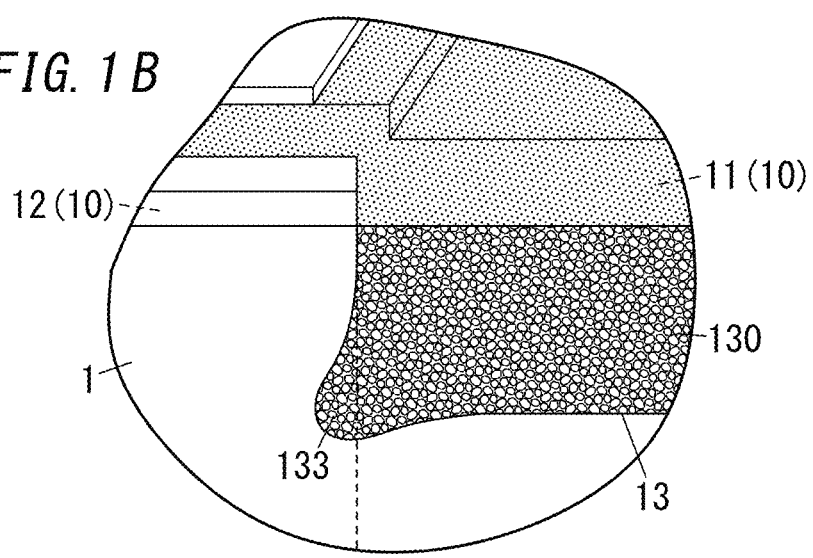
FIG. 1B is an enlarged view illustrating a main part of the capacitor of FIG. 1A.

As shown in FIGS. 1A and 1B, a capacitor 100 according to the present embodiment includes a silicon substrate 1, a conductor layer 2, and a dielectric layer 3. The silicon substrate 1 has a principal surface 10 including a capacitance generation region 11 and a non-capacitance generation region 12. The silicon substrate 1 has a porous part 13 provided in a thickness direction in the capacitance generation region 11. The conductor layer 2 has a surface layer part 21 at least covering part of a surface of the capacitance generation region 11 and a filling part 22 filled in at least part of fine pores 130 of the porous part 13. The dielectric layer 3 is provided between an inner surface of the fine pores 130 and the filling part 22.

In the capacitor 100 of the present embodiment, the silicon substrate 1 can constitute a first electrode, and the conductor layer 2 can constitute a second electrode different from the first electrode, and therefore, at a portion where the silicon substrate 1, the dielectric layer 3, and the conductor layer 2 are stacked on one another, electrostatic capacitance is generated. In general, the electrostatic capacitance of the capacitor 100 can be increased by increasing the surface areas of electrodes (the first electrode and the second electrode). In the capacitor 100 of the present embodiment, the porous part 13 provided in the thickness direction in the capacitance generation region 11 in the principal surface 10 of the silicon substrate 1 and the filling part 22 filled in the porous part 13 easily secure the surface areas of the first electrode and the second electrode, which can increase the electrostatic capacitance of the capacitor 100.

Moreover, in the capacitor 100 of the present embodiment, the entirety of the principal surface 10 of the silicon substrate 1 is not made porous, but the porous part 13 is formed in the capacitance generation region 11, and therefore, the strength of the silicon substrate 1 can be suppressed from being reduced as compared to the case where the entirety of the principal surface 10 is made porous.

(2) Details

The capacitor 100 of the present embodiment and a method for producing the capacitor 100 will be described in detail below.

(2.1) Capacitor

As described above, the capacitor 100 of the present embodiment includes the silicon substrate 1, the conductor layer 2, and the dielectric layer 3. The capacitor 100 of the present embodiment further includes an inorganic insulating layer 4 and contact terminals 5. Each of these components included in the capacitor 100 of the present embodiment will be described below.

<Silicon Substrate>

The silicon substrate 1 is a member constituting an electrode as described above, and the silicon substrate 1 of the present embodiment constitutes the first electrode. Thus, the silicon substrate 1 has a conductive property.

The silicon substrate 1 is not particularly limited as long as it is a substrate which is made of silicon and which is generally used for, for example, producing of integrated circuits. The silicon substrate 1 may be a p-type semiconductor or may be an n-type semiconductor. When the silicon substrate 1 is a p-type semiconductor, the silicon substrate 1 can be doped with a small amount of an element such as boron or aluminum (a small amount of an element such as boron or aluminum can be added to the silicon substrate 1). Alternatively, when the silicon substrate 1 is an n-type semiconductor, the silicon substrate 1 can be doped with a small amount of element such as phosphorus or arsenic (a small amount of element such as phosphorus or arsenic can be added to the silicon substrate 1).

The thickness of the silicon substrate 1 is not particularly limited but is preferably greater than or equal to, for example, 400 μm and less than or equal to 1000 μm.

The silicon substrate 1 has a rectangular shape in plan view (viewed in a thickness direction of the silicon substrate 1), but the shape of the silicon substrate 1 in plan view is not limited to this example. For example, the silicon substrate 1 may have a triangular shape in plan view, may have a polygonal shape having more vertices than a triangular shape, or may have a circular shape. Note that plan view means that the silicon substrate 1 is viewed in its thickness direction.

As shown in FIGS. 1A and 1B, the silicon substrate 1 has the principal surface 10 (the principal surface 10 is hereinafter also referred to as a first principal surface 10) and a second principal surface 14 located on an opposite side of the principal surface 10.

In the silicon substrate 1 of the present embodiment, the first principal surface 10 includes the capacitance generation region 11 and the non-capacitance generation region 12. The capacitance generation region 11 is a region formed in the capacitor 100 aimed to generate electrostatic capacitance. Thus, the non-capacitance generation region 12 is a region except for the capacitance generation region 11 in the first principal surface 10 but is not a region in which no electrostatic capacitance is generated. In the non-capacitance generation region 12, electrostatic capacitance may be generated. Moreover, in the present embodiment, the non-capacitance generation region 12 has an oxidized surface. That is, the surface of the non-capacitance generation region 12 is made of oxide of the silicon substrate 1 and is made of, for example, oxidized silicon ($SiO_2$). Thus, the capacitor 100 of the present embodiment includes an oxidized coating 120 made of oxidized silicon on the non-capacitance generation region 12.

The size of the capacitance generation region 11 depends on the size of the first principal surface 10 but is preferably greater than or equal to, for example, $4 \times 10^2$ μm$^2$ and is preferably less than or equal to 1 mm$^2$.

In the present embodiment, the porous part 13 provided in the thickness direction in the capacitance generation region 11 of the first principal surface 10 (see FIGS. 1A and 1B). The porous part 13 of the present embodiment has the fine pores 130. In the present embodiment, the fine pores 130 are longitudinally elongated pores (see FIGS. 6A and 6D). Specifically, the fine pores 130 extend from a plurality of locations in the capacitance generation region 11 along a direction transverse to the principal surface 10 (in the present embodiment, the thickness direction of the silicon substrate 1). In other words, the fine pores 130 are a plurality of fine non-through holes formed in the porous part 13 to extend from the capacitance generation region 11 of the first principal surface 10 toward the second principal surface 14. Thus, the plurality of non-through holes included in the fine pores 130 are open in the capacitance generation region 11 of the first principal surface 10. As described above, the fine pores 130 extend along the thickness direction of the silicon substrate 1 in the present embodiment. The plurality of fine pores 130 are aligned substantially parallel to each other. This can increase the surface areas of the inner surfaces of the fine pores 130 included in the porous part 13, thereby increasing the electrostatic capacitance of the capacitor 100.

Moreover, all of the plurality of non-through holes included in the fine pores 130 may be connected to each other, or the plurality of non-through holes included in the fine pores 130 may include non-connected (independent) non-through holes. The porous part 13 may be provided to the entirety of the capacitance generation region 11 or may be provided to part of the capacitance generation region 11. Moreover, the non-capacitance generation region 12 has almost no opening of the fine non-through holes included in the fine pores 130, but some of the fine non-through holes included in the fine pores 130 may be provided under the non-capacitance generation region 12 (at a portion underlying the non-capacitance generation region 12 of the silicon substrate 1 in the thickness direction). For example, as shown in FIG. 1B, the porous part 13 has a corner 133 which extends from a portion underlying the capacitance generation region 11 of the silicon substrate 1 in the thickness direction into the portion underlying the non-capacitance generation region 12 of the silicon substrate 1 in the thickness direction. That is, the corner 133 may be provided under the non-capacitance generation region 12, and the corner 133 may underlie the non-capacitance generation region 12 in the thickness direction. Moreover, the corner 133 is part of the porous part 13, and therefore, in the present embodiment, the part of the porous part 13 may extend into the portion underlying the non-capacitance generation region 12 of the silicon substrate 1 in the thickness direction. That is, the part of the porous part 13 may underlie the non-capacitance generation region 12 of the silicon substrate 1 in the thickness direction. Moreover, the part of the porous part 13 may exist in the portion underlying the non-capacitance generation region 12 of the silicon substrate 1 in the thickness direction.

The thickness of the porous part 13 (the distance from a surface 110 of the capacitance generation region 11 to a bottom of the porous part 13) is preferably greater than or equal to 30 μm. In this case, the surface areas of the inner surfaces of the fine pores 130 is easily secured, and the electrostatic capacitance of the capacitor 100 is easily improved. Note that the thickness of the porous part 13 means the average value of distances from the first principal surface 10 to bottoms of the fine pores 130 in a direction along the thickness direction of the silicon substrate 1. Moreover, the thickness of the porous part 13 is preferably, for example, less than or equal to 50 μm. In this case, the porous part 13 can be suppressed from being damaged when the conductor layer 2 (the filling part 22) is formed in the porous part 13. For example, the amount of time for performing an anode oxidation process in a porous part forming step described later may be adjusted to adjust the thickness of the porous part 13.

Moreover, some of the fine pores 130 in the porous part 13 may extend through the second principal surface 14. That is, part of the porous part 13 may be exposed at the second principal surface 14 located on an opposite side of the silicon substrate 1 from the principal surface 10. In this case, a maximum value of the thickness of the porous part 13 is equal to the thickness of the silicon substrate 1.

In the capacitor 100 shown in FIGS. 1A and 1B, the porous part 13 is provided to the entirety of the capacitance generation region 11. Moreover, the porous part 13 includes the plurality of fine non-through holes as described above. The average value of diameters of the non-through holes included in the fine pores 130 is preferably greater than or equal to 100 nm. In this case, the strength of the porous part 13 is easily secured, and the porous part 13 can be suppressed from being damaged when the fine pores 130 of the porous part 13 is filled with the conductor layer 2 (the filling part 22) described later. Further, the average value of diameters of the non-through holes included in the fine pores 130 is preferably less than or equal to 5 μm. In this case, the surface areas of the inner surfaces of the fine pores 130 is easily increased, and the electrostatic capacitance of the capacitor 100 is easily increased. Furthermore, the average value of diameters of the non-through holes included in the fine pores 130 is particularly preferably greater than or equal to 1 μm and less than or equal to 4 μm. In this case, both securing of the electrostatic capacitance of the capacitor 100 and the strength of the porous part 13 are achievable.

In the present embodiment, the surface enlargement ratio of the porous part 13 is preferably greater than or equal to 200. The surface enlargement ratio of the porous part 13 means the ratio of the actual surface area of the porous part 13 (the total surface area of the inner surfaces of the fine pores 130) to the area of the surface of the porous part 13 viewed (the area of the capacitance generation region 11). That is, the porous part 13 preferably has a surface area 200 or more times the area of the capacitance generation region 11. In this case, the electrostatic capacitance of the capacitor 100 can be improved. The surface enlargement ratio of the porous part 13 is preferably less than or equal to 5000. That is, the porous part 13 preferably has a surface area 5000 or less times the area of the capacitance generation region 11. In this case, the strength of the porous part 13 is easily secured, and the porous part 13 can be suppressed from being damaged when the fine pores 130 of the porous part 13 is filled with the conductor layer 2 (the filling part 22) described later. In order to achieve both the electrostatic capacitance of the capacitor 100 and the strength of the porous part 13, the surface enlargement ratio of the porous part 13 is particularly preferably greater than or equal to 500 and less than or equal to 2000. That is, the porous part 13 preferably has a surface area greater than or equal to 500 times and less than or equal to 2000 times the area of the capacitance generation region 11.

<Conductor Layer>

As described above, the conductor layer 2 is a member constituting an electrode, and the conductor layer 2 of the present embodiment constitutes the second electrode different from the first electrode. Thus, the conductor layer 2 has a conductive property.

The conductor layer 2 is preferably made of a conductive material. Examples of the conductive material suitable for producing the capacitor 100 of the present embodiment include polysilicon, platinum, and ruthenium. Thus, the conductor layer 2 of the present embodiment preferably includes at least one kind of element selected from the group consisting of polysilicon, platinum, and ruthenium. These materials are materials having a low resistance value and can thus improve the conductive property of the conductor layer 2. The conductor layer 2 particularly preferably contains polysilicon. In this case, the equivalent series resistance (ESR) of the capacitor 100 can be reduced. Moreover, including polysilicon into the conductor layer 2 can reduce the linear expansivity difference between the silicon substrate 1 and the conductor layer 2 and suppress stress from being caused due to the linear expansivity difference even when the temperature of the capacitor 100 increases. Moreover, when the conductor layer 2 includes polysilicon, the polysilicon is preferably doped with an impurity (a dopant). In this case, the band gap of the polysilicon can be reduced, which can improve the conductive property of the conductor layer 2. Examples of the dopant include boron (B), phosphorus (P), and arsenic (As).

The conductor layer 2 of the present embodiment includes the surface layer part 21 and the filling part 22 (see FIGS. 1A and 1B).

In the capacitance generation region 11, the surface layer part 21 covers at least part of a surface of the porous part 13. In other words, the surface layer part 21 is provided on the openings of a large number of non-through holes included in the fine pores 130 of the porous part 13 and closes these openings. Since the surface of the porous part 13 is the surface 110 of the capacitance generation region 11, the surface layer part 21 covers at least part of the surface 110 of the capacitance generation region 11. The surface layer part 21 may cover the entirety of the surface 110 of the capacitance generation region 11 or does not have to cover the entirety of the surface 110 of the capacitance generation region 11, that is, the surface layer part 21 does not have to cover part of the surface 110 of the capacitance generation region 11. The thickness of the surface layer part 21 is preferably greater than or equal to 1 μm. In this case, the strength of the surface layer part 21 can be improved, and thereby, the strength of the filling part 22 connected to the surface layer part 21 can also be improved, and the strength of the conductor layer 2 can thus be improved. Moreover, the thickness of the surface layer part 21 is preferably less than or equal to 200 μm. In this case, the equivalent series resistance (ESR) of the capacitor 100 can be suppressed from increasing.

The filling part 22 is filled in at least part of the fine pores 130 included in the porous part 13. Thus, at least some of the large number of non-through holes included in the fine pores 130 is filled with the filling part 22 which is part of the conductor layer 2. That is, the fine pores 130 does not have to be fully filled with the filling part 22 but may have a portion which is not filled with the filling part 22. In the capacitor 100 of the present embodiment, the filling part 22 is preferably continuous with the surface layer part 21. Specifically, the filling part 22 and the surface layer part 21 are preferably continuous with each other at openings of the large number of fine non-through holes included in the fine pores 130.

In the capacitor 100 of the present embodiment, the conductor layer 2 is also provided on part of the non-capacitance generation region 12. Between the conductor layer 2 on the non-capacitance generation region 12 and the silicon substrate 1, an insulating coating is provided, which can generate electrostatic capacitance also in the non-capacitance generation region 12. Moreover, in the capacitor 100 of the present embodiment, the conductor layer 2 on the non-capacitance generation region 12 and the surface layer part 21 are continuous with each other. In the present embodiment, the surface layer part 21 and the filling part 22 are continuous with each other, and therefore, the conductor layer 2 on the non-capacitance generation region 12, the surface layer part 21, and the filling part 22 are continuous with one another. The conductor layer 2 provided on the non-capacitance generation region 12 may be, but does not have to be, flush with the surface layer part 21. In the capacitor 100 of the present embodiment, the conductor layer 2 on the non-capacitance generation region 12 and the surface layer part 21 are not flush with each other, a level difference is provided at the border therebetween, and the surface layer part 21 is lower than the conductor layer 2 on the non-capacitance generation region 12. The dimension of the level difference between the surface layer part 21 and the conductor layer 2 on the non-capacitance generation region 12 is preferably, for example, greater than or equal to 0.2 μm and less than or equal to 2.0 μm.

<Dielectric Layer>

The dielectric layer 3 is an insulating coating. Moreover, in the capacitor 100 of the present embodiment, the dielectric layer 3 is provided between the inner surface of the fine pores 130 included in the porous part 13 and the filling part 22 which is part of the conductor layer 2 and which is filled in the fine pores 130.

The material for the dielectric layer 3 is not particularly limited as long as it has an insulation property but is preferably, for example, oxidized silicon ($SiO_2$). In this case, the dielectric layer 3 can be formed by oxidizing the inner surfaces of the fine pores 130 included in the porous part 13 which is part of the silicon substrate 1. In addition, the dielectric layer 3 may be an Oxide/Nitride/Oxide film (ONO film). As shown in FIG. 6D, the ONO film includes a first silicon oxide film 31 ($SiO_2$), a nitride film 33 ($Si_3N_4$), and a second silicon oxide film 32 ($SiO_2$). The first silicon oxide film 31, the nitride film 33, and the second silicon oxide film 32 are stacked in this order to form the ONO film. Other examples of the material for the dielectric layer 3 include titanium oxide, oxidation zirconium, oxidation hafnium, oxidation vanadium, oxidation tungsten, oxidation niobium, oxidation tantalum, and aluminum oxide.

The thickness of the dielectric layer 3 is preferably, for example, greater than or equal to 10 nm. In this case, the inner surfaces of the fine pores 130 are easily insulated from the filling part 22. Moreover, the thickness of the dielectric layer 3 is preferably, for example, less than or equal to 500 nm. In this case, the fine pores 130 can be easily filled with the filling part 22, the strength of the filling part 22 is easily improved, and the strength of the conductor layer 2 is also easily improved.

<Inorganic Insulating Layer>

The capacitor 100 of the present embodiment includes the inorganic insulating layer 4. The inorganic insulating layer 4 is an insulating coating made of an inorganic material. The inorganic insulating layer 4 is used to suppress a short circuit (a short) from being formed between the silicon substrate 1 constituting the first electrode and the conductor layer 2 constituting the second electrode.

In the capacitor 100 of the present embodiment, the inorganic insulating layer 4 is provided on the non-capacitance generation region 12. Thus, the silicon substrate 1 and the conductor layer 2 are easily insulated from each other in the non-capacitance generation region 12. The inorganic insulating layer 4 may be provided on the entire surface of the non-capacitance generation region 12 or does not have to be provided on the entire surface of the non-capacitance generation region 12. In the capacitor 100 of the present embodiment, the inorganic insulating layer 4 is provided on the entire surface of the non-capacitance generation region 12. The thickness of the inorganic insulating layer 4 is preferably, for example, greater than or equal to 0.5 μm. In this case, the inorganic insulating layer 4 can be suppressed from being damaged in a later-described step of forming the porous part 13. Moreover, an upper limit value of the thickness of the inorganic insulating layer 4 is not particularly limited but is preferably, for example, less than or equal to 2.0 μm.

The material for the inorganic insulating layer 4 is not particularly limited as long as the inorganic insulating layer 4 is made of an inorganic material having an insulation property. In the present embodiment, the inorganic insulating layer 4 preferably includes at least silicon nitride (SiN). In this case, the insulation property of the inorganic insulating layer 4 can be satisfactorily secured, the inorganic insulating layer 4 can be suppressed from being damaged also in the later-described step of forming the porous part 13, and further, the linear expansivity difference between the silicon substrate 1 and the inorganic insulating layer 4 can be reduced, and therefore, the capacitor 100 can be suppressed from warping. Naturally, the inorganic insulating layer 4 may contain a component other than silicon nitride.

In the capacitor 100 of the present embodiment, the inorganic insulating layer 4 is provided between the conductor layer 2 above the non-capacitance generation region 12 and the silicon substrate 1. That is, the silicon substrate 1 (the non-capacitance generation region 12), the inorganic insulating layer 4, and the conductor layer 2 are stacked in this order. Thus, in the capacitor 100 of the present embodiment, electrostatic capacitance can be generated at a portion of the non-capacitance generation region 12 provided with the conductor layer 2.

<Contact Terminal>

The capacitor 100 of the present embodiment includes the contact terminals 5. The contact terminals 5 can be used, for example, to connect a substrate and the capacitor 100 to each other when the capacitor 100 is mounted on the substrate. The material for the contact terminal 5 is not particularly limited as long as it is a material to be used for a contact point or the like of an electronic component and having an excellent conductive property, and examples of the material includes gold, silver, copper, platinum, and ruthenium. In the present embodiment, the contact terminals 5 are preferably made of titanium and preferably are plated with gold. In this case, both the strength of the contact terminal 5 and the conductive property are achievable. The shape of the contact terminal 5 in plan view is not particularly limited.

The contact terminal 5 of the present embodiment includes a first contact terminal 51 and a second contact terminal 52. The first contact terminal 51 and the second contact terminal 52 are both provided above the silicon substrate 1 and are exposed outside above the silicon substrate 1.

The first contact terminal 51 is in ohmic contact with the silicon substrate 1, and thereby, the first contact terminal 51 is electrically connected with the silicon substrate 1 constituting the first electrode. Specifically, the first contact terminal 51 is provided in a through hole formed in the inorganic insulating layer 4, and a portion of the first contact terminal 51 is provided on the inorganic insulating layer 4. In the capacitor 100 of the present embodiment, a portion of the first contact terminal 51 provided in the through hole formed in the inorganic insulating layer 4 is more depressed than the portion of the first contact terminal 51 provided on the inorganic insulating layer 4. Moreover, in the capacitor 100 of the present embodiment, an oxidized coating 120 made of oxidized silicon is provided on the surface of the silicon substrate 1, and the first contact terminal 51 penetrates through the oxidized coating 120 to come into ohmic contact with the silicon substrate 1. Thus, the first contact terminal 51 and the silicon substrate 1 can be electrically connected to each other. The thickness of the portion of the first contact terminal 51 provided on the inorganic insulating layer 4 is preferably greater than or equal to 200 nm and less than or equal to 500 nm to secure strength and connection reliability.

The second contact terminal 52 is in ohmic contact with the conductor layer 2, and thereby, the second contact terminal 52 is electrically connected to the conductor layer 2 constituting the second electrode. Specifically, the second contact terminal 52 is provided on the conductor layer 2 provided above the non-capacitance generation region 12. Thus, the second contact terminal 52 is in ohmic contact with the conductor layer 2 on the non-capacitance generation region 12, and thereby, the second contact terminal 52 is electrically connected to the conductor layer 2 on the non-capacitance generation region 12. Moreover, in the capacitor 100 of the present embodiment, the conductor layer 2 above the non-capacitance generation region 12 and the surface layer part 21 are continuous with each other, and the surface layer part 21 and the filling part 22 are continuous with each other. Thus, in the capacitor 100 of the present embodiment, the second contact terminal 52 is electrically connected to the surface layer part 21, and the second contact terminal 52 is electrically connected to the filling part 22. The thickness of the second contact terminal 52 is preferably greater than or equal to 200 nm and less than or equal to 500 nm in order to secure strength and connection reliability.

The difference in height between the first contact terminal 51 and the second contact terminal 52 is preferably less than or equal to 2.0 μm. In this case, the first contact terminal 51 and the second contact terminal 52 are easily provided on a substrate or the like.

(2.2) Method for Producing Capacitor

The method for producing the capacitor 100 of the present embodiment will be described below. The method for producing the capacitor 100 of the present embodiment includes a masking step, a porous part forming step, a dielectric layer forming step, and a conductor layer forming step. These steps will be described with reference to FIGS. 2A to 2D, FIGS. 3A to 3D, FIG. 4, and FIGS. 5A to 5E.

<Masking Step>

The masking step includes providing a masking layer 40 on the non-capacitance generation region 12 of the silicon substrate 1 having the principal surface 10 including the capacitance generation region 11 and the non-capacitance generation region 12. Specifically, the masking layer 40 is formed by the following method.

Figure 2A:
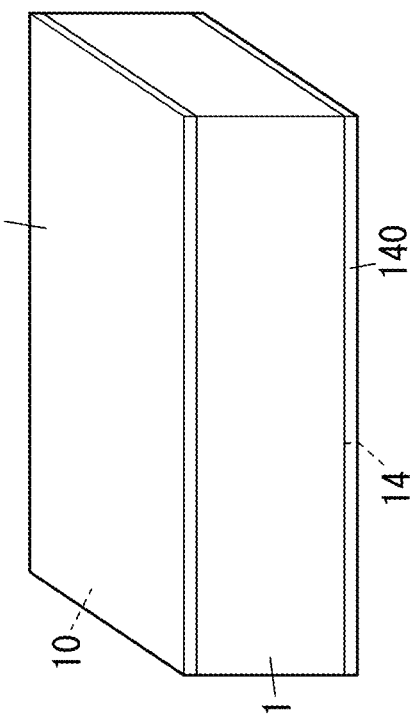
FIG. 2A to FIG. 2D are perspective views schematically illustrating an example of a method for producing the capacitor according to the embodiment of the present disclosure.

First of all, the silicon substrate 1 is prepared as shown in FIG. 2A.

Figure 2B:
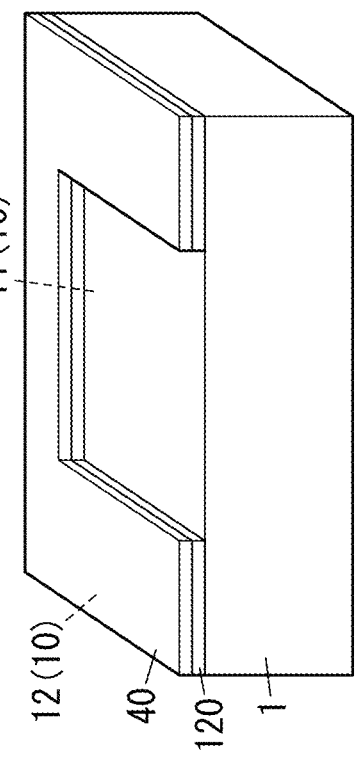

Then, as shown in FIG. 2B, the silicon substrate 1 is subjected to a thermal oxidation process. This forms the oxidized coating 120 made of oxidized silicon on the first principal surface 10 of the silicon substrate 1 and an oxidized coating 140 made of oxidized silicon on the second principal surface 14, which can secure insulation properties of the first principal surface 10 and the second principal surface 14 of the silicon substrate 1. The condition of the thermal oxidation process is preferably, for example, that the heating temperature is higher than or equal to 1000° C. and lower than or equal to 1200° C. in an oxygen atmosphere. In the present embodiment, the oxidized coating 120 is formed on the entirety of the first principal surface 10. This oxidized coating 120 can secure the insulation property of the first principal surface 10 of the silicon substrate 1.

Figure 2C:
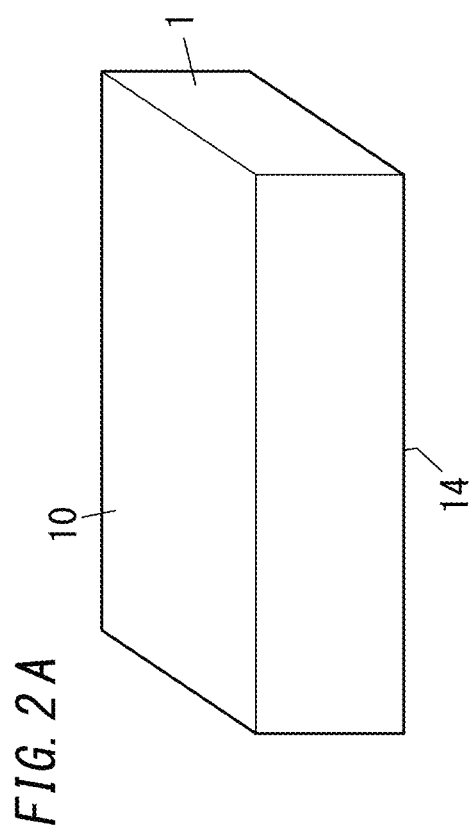

Next, as shown in FIG. 2C, the masking layer 40 is formed on the oxidized coating 120 provided on the first principal surface 10. In the present embodiment, the masking layer 40 is formed on the entire surface of the oxidized coating 120. The masking layer 40 preferably adopts a coating which is less likely to be deteriorated and changed in property by the anode oxidation process described later. The masking layer 40 is preferably, for example, a coating of metal such as chrome, or gold, a coating made of an organic resin used as a resist material adopted to produce a printed wiring board or the like, or a coating made of silicon nitride. In the present embodiment, the masking layer 40 is particularly preferably a coating made of silicon nitride. In this case, the linear expansivity difference between the silicon substrate 1 and the masking layer 40 can be reduced in the case where a masking layer including silicon nitride remains in the capacitor 100, and thereby, the capacitor 100 can be suppressed from warping. In the following description, an example in which the masking layer 40 is made of silicon nitride will be described. When the masking layer 40 is made of silicon nitride, the masking layer 40 may be produced by, for example, chemical vapor deposition (CVD) or plasma CVD.

Figure 2D:
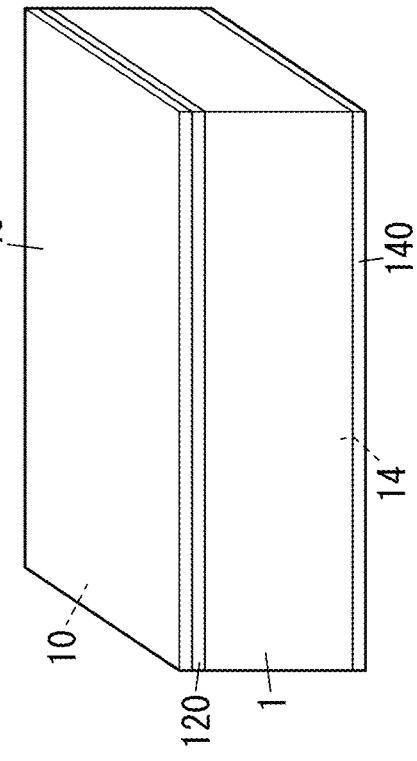

Next, as shown in FIG. 2D, a portion of the masking layer 40 which overlaps the capacitance generation region 11 is removed (patterned) by a publicly known method. At this time, a portion of the oxidized coating 120 which overlaps the capacitance generation region 11 is also removed. This can leave the masking layer 40 on the non-capacitance generation region 12. Moreover, the capacitance generation region 11 of the first principal surface 10 can be exposed. Moreover, in the non-capacitance generation region 12, the oxidized coating 120 and the masking layer 40 are stacked in this order. A method for patterning the masking layer 40 is not particularly limited, but, for example, plasma etching may be adopted.

Moreover, in the masking step, the oxidized coating 140 formed on the second principal surface 14 is preferably removed (see FIG. 2D).

Moreover, in the above-described method, the portion overlapping the capacitance generation region 11 is removed from the masking layer 40 formed on the entirety of the first principal surface 10 to leave the masking layer 40 on the non-capacitance generation region 12, but this should not be construed as limiting. For example, the masking layer 40 may directly be formed only on the non-capacitance generation region 12. In this case, the portion of the oxidized coating 120 overlapping the capacitance generation region 11 has to be removed.

<Porous Part Forming Step>

The porous part forming step includes, by the anode oxidation process, forming the porous part 13 in the capacitance generation region 11 in the thickness direction of the silicon substrate 1 by forming the fine pores 130 in the capacitance generation region 11 which is not covered with the masking layer 40. Specifically, the porous part 13 is formed by the following method.

Figure 3A:
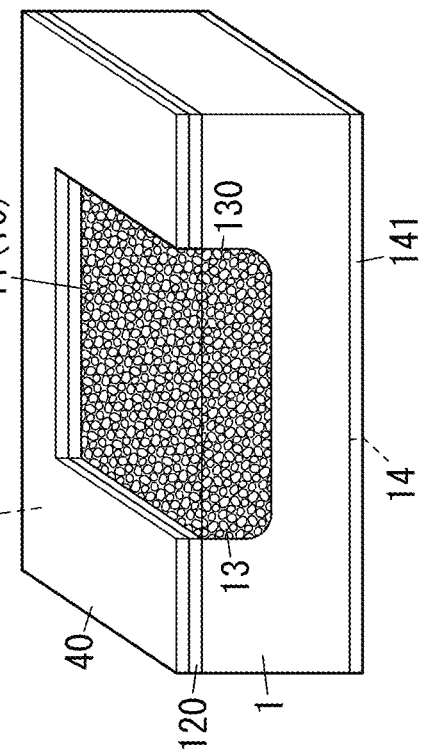
FIG. 3A to FIG. 3C are perspective views schematically illustrating the example of the method for producing the capacitor according to the embodiment of the present disclosure.

First of all, as shown in FIG. 3A, a back surface electrode 141 is formed on the second principal surface 14. The back surface electrode 141 is an electrode used when the silicon substrate 1 is subjected to the anode oxidation process, and the back surface electrode 141 is an electrically conductive coating. Thus, the silicon substrate 1 and the back surface electrode 141 are preferably in ohmic contact with each other, and thereby, the silicon substrate 1 and the back surface electrode 141 are preferably electrically connected to each other. In the present embodiment, the back surface electrode 141 is preferably formed on the entirety of the second principal surface 14.

Figure 3B:
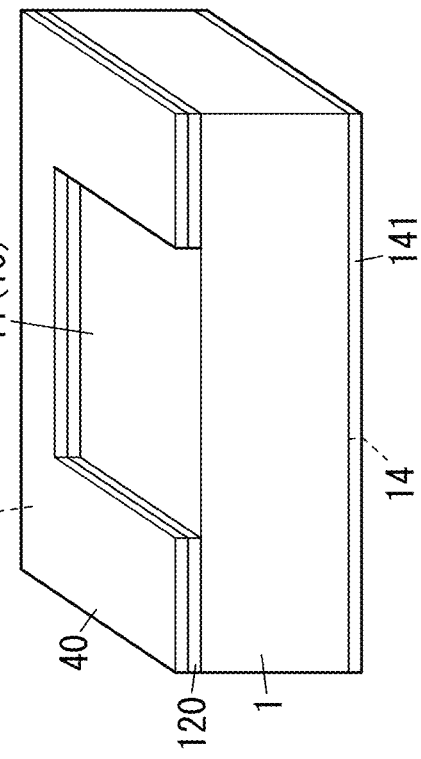

Then, as shown in FIG. 3B, the silicon substrate 1 is subjected to the anode oxidation process. Specifically, the silicon substrate 1 is placed in mixed liquid, and a current is caused to flow between the back surface electrode 141 provided on the second principal surface 14 and the mixed liquid including an acid. This forms the fine pores 130 in the capacitance generation region 11 which is exposed. In contrast, no fine pore 130 is formed in the non-capacitance generation region 12 covered with the masking layer 40. Forming the fine pores 130 in the capacitance generation region 11 forms the porous part 13 in the thickness direction of the silicon substrate 1 in the capacitance generation region 11. In the present embodiment, the mixed liquid used in the anode oxidation process is preferably mixed liquid of hydrofluoric acid (HF) and ethanol. In this case, the porous part 13 is easily formed in the silicon substrate 1.

Figure 3C:
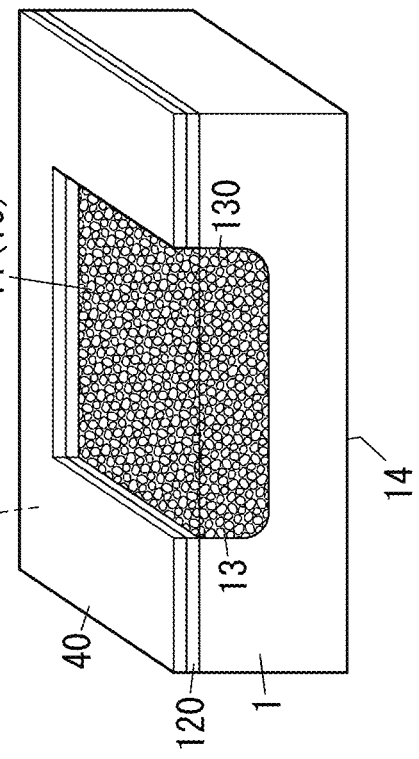
Figure 4:
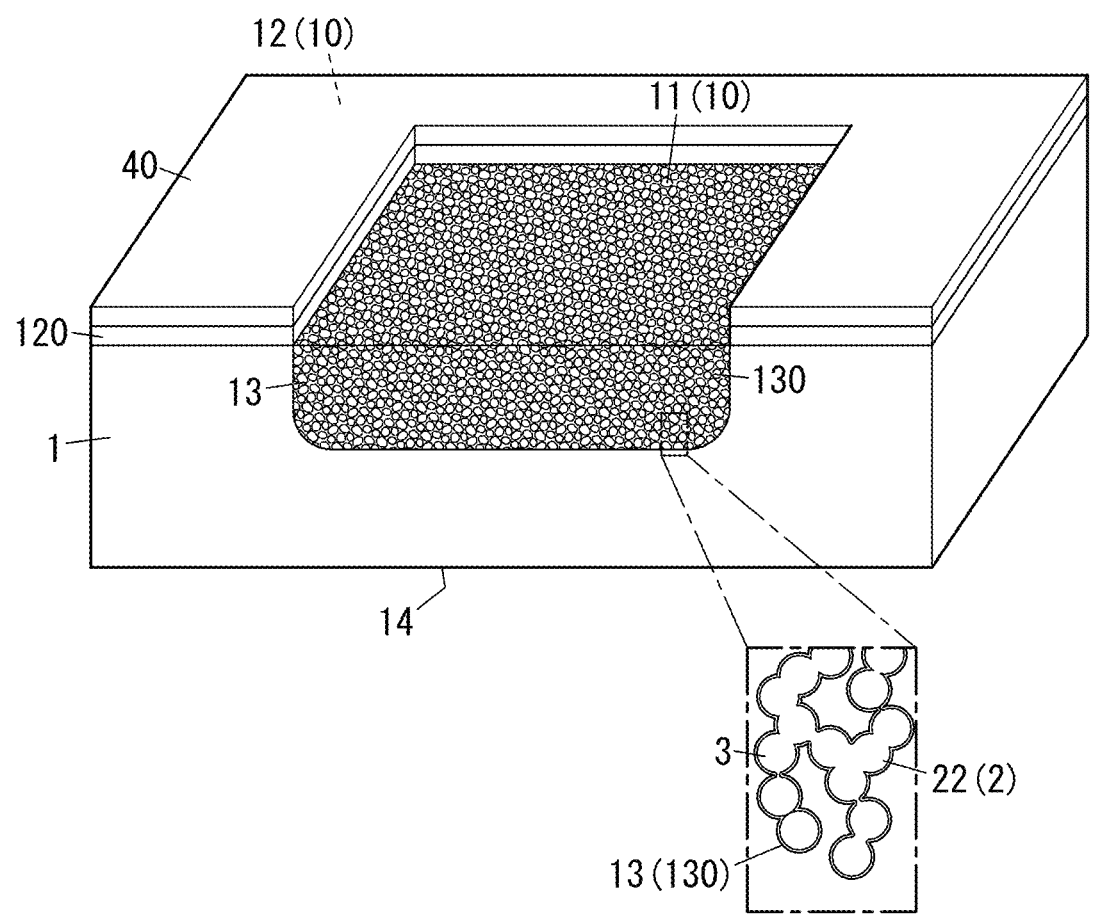
FIG. 4 is a perspective view schematically illustrating the example of the method for producing the capacitor according to the embodiment of the present disclosure.

Next, as shown in FIG. 3C, the back surface electrode 141 provided on the second principal surface 14 is removed.

As described above, increasing the surface area of the porous part 13 (the surface areas of the inner surfaces of the fine pores 130) can increase the electrostatic capacitance of the capacitor 100, where the surface area of the porous part 13 is influenced by the diameter and the depth of the fine non-through holes included in the fine pore 130. The diameter and the depth of the non-through holes can be controllable by, for example, the following parameters (a) to (c).

(a) The electric conductivity of the silicon substrate 1, that is, the amount of impurity contained in the silicon substrate 1.

(b) The concentration of hydrofluoric acid in the mixed liquid.

(c) Current density ($A/cm^2$) represented by the value of a current which flows between the back surface electrode 141 and the mixed liquid to the area of the capacitance generation region 11.

For example, in the present embodiment, the concentration of the hydrofluoric acid in a mixer is preferably greater than or equal to 1 weight % and less than or equal to 80 weight %, preferably greater than or equal to 20 weight % and less than or equal to 40 weight %. In this case, the masking layer 40 can be suppressed from being deteriorated and changed in property due to the hydrofluoric acid, and the average value of diameters of the non-through holes included in the fine pores 130 can be adjusted to be within the range from 100 nm to 5 μm inclusive.

Moreover, when the silicon substrate 1 is subjected to the anode oxidation process, electric fields tend to concentrate on a portion corresponding to the corner 133 of the porous part 13. Thus, as shown in FIG. 1B, the corner 133 of the porous part 13 extends from the portion underlying the capacitance generation region 11 of the silicon substrate 1 in the thickness direction into the portion underlying the non-capacitance generation region 12 of the silicon substrate 1 in the thickness direction.

Moreover, when the silicon substrate 1 is an n-type semiconductor, the silicon substrate 1 is preferably irradiated with light and is then subjected to the anode oxidation process. Specifically, the silicon substrate 1 is preferably irradiated with light before the silicon substrate 1 is subjected to the thermal oxidation process.

Preferably, after the silicon substrate 1 is made porous and before the dielectric layer forming step, impurity diffusion is performed to form a high-concentration region of an impurity on the inner surfaces of the fine pores 130 of the porous part 13. Examples of an impurity diffusion method include heat diffusion. Examples of the impurity include phosphorus (P) and boron (B). As described above, forming the high-concentration region of the impurity on the inner surfaces of the fine pores 130 can reduce the equivalent series resistance (ESR) of the capacitor 100. Moreover, making a depletion layer (an electrically insulated region) less likely to be formed can suppress the electrostatic capacitance of the capacitor 100 from being reduced.

<Dielectric Layer Forming Step>

The dielectric layer forming step includes forming the dielectric layer 3 on the inner surfaces of the fine pores 130. Specifically, the silicon substrate 1, in which the porous part 13 has been formed in the porous part forming step described above, is subjected to the thermal oxidation process. This oxidizes the inner surfaces of the fine pores 130 included in the porous part 13. Since the porous part 13 is part of the silicon substrate 1, oxidizing the inner surfaces of the fine pores 130 forms a coating made of oxidized silicon, thereby providing the dielectric layer 3 (see FIG. 4). Moreover, the thermal oxidation process has to be performed such that the dielectric layer 3 can secure the insulation property of the inner surfaces of at least the fine pores 130. The condition of the thermal oxidation process is preferably, for example, that the heating temperature is higher than or equal to 800° C. and lower than or equal to 1200° C. in an oxygen atmosphere. Moreover, silicon nitride formed by chemical vapor deposition (CVD) may further be used as a dielectric.

<Conductor Layer Forming Step>

The conductor layer forming step includes forming the conductor layer 2 including the filling part 22 filled in at least part of the fine pores 130 and the surface layer part 21 at least covering part of the surface 110 of the capacitance generation region 11. Specifically, the conductor layer 2 is formed by the following method.

First of all, as shown in FIG. 5A, the conductor layer 2 is formed on the entirety of the first principal surface 10 of the silicon substrate 1. That is, the conductor layer 2 is formed to cover the capacitance generation region 11 and the non-capacitance generation region 12. As described above, the conductor layer 2 includes at least one kind of element selected from the group consisting of polysilicon, platinum, and ruthenium. For example, when the conductor layer 2 includes polysilicon, the conductor layer 2 may be formed by chemical vapor deposition (CVD). When the conductor layer 2 made of polysilicon is formed by CVD, at least part of the fine pores 130 are filled with the polysilicon. A layer made of the polysilicon filled in the fine pores 130 serves as the filling part 22 of the conductor layer 2. Moreover, a layer made of the polysilicon is formed also on the surface 110 of the capacitance generation region 11. The layer made of the polysilicon formed on the surface 110 serves as the surface layer part 21 of the conductor layer 2. Moreover, forming the conductor layer 2 on the entirety of the first principal surface 10 forms a layer made of the polysilicon also on the non-capacitance generation region 12. A temperature at the time of forming the conductor layer 2 made of the polysilicon by CVD is not particularly limited but is preferably, for example, higher than or equal to 400° C. and lower than or equal to 900° C.

Then, part of a portion which is included the conductor layer 2 formed on the entirety of the first principal surface 10 and which overlaps the non-capacitance generation region 12 is removed as illustrated in FIG. 5B. This exposes the masking layer 40 provided on the non-capacitance generation region 12. Moreover, in the present embodiment, part of the conductor layer 2 is left on the non-capacitance generation region 12. Thus, at a portion of the non-capacitance generation region 12 on which the conductor layer 2 is left, the masking layer 40 is not exposed, and the oxidized coating 120, the masking layer 40, and the conductor layer 2 are stacked in this order. A method for removing the conductor layer 2 is not particularly limited but may use, for example, a semiconductor laser.

Next, as shown in FIG. 5C, the oxidized coating 120 and the masking layer 40 exposed in the non-capacitance generation region 12 are partially removed. This can expose the silicon substrate 1 in the non-capacitance generation region 12. Moreover, the insulation property of a portion of the non-capacitance generation region 12 can be secured, the portion being covered with the masking layer 40 and the oxidized coating 120. Moreover, the masking layer 40 provided on the non-capacitance generation region 12 serves as the inorganic insulating layer 4 included in the capacitor 100 shown in FIGS. 1A and 1B. Thus, as in the present embodiment, the inorganic insulating layer 4 including silicon nitride is obtained when the masking layer 40 is made of silicon nitride.

Next, as shown in FIG. 5D, the entirety of the first principal surface 10 is covered with a layer 50 made of metal used as a material for the contact terminals 5. Then, the layer 50 is removed such that part of the layer 50 is left as shown in FIG. 5E, thereby forming the first contact terminal 51 and the second contact terminal 52. Specifically, of the layer 50 made of the metal, a portion located on an exposed portion of the silicon substrate 1 and its peripheral part on the non-capacitance generation region 12 is left, thereby producing the first contact terminal 51. Moreover, of the layer 50 made of the metal, a portion located on the conductor layer 2 provided above the non-capacitance generation region 12 is left, thereby producing the second contact terminal 52.

Through the steps described above, the capacitor 100 shown in FIGS. 1A and 1B are produced.

2. Second Embodiment (1) Schema

Next, a method for producing a capacitor 100 of a second embodiment will be described with reference to the drawings. In the second embodiment, components similar to those in the first embodiment are dented by the same reference signs as those in the first embodiment, and the detailed description thereof may be omitted.

Figure 7A:
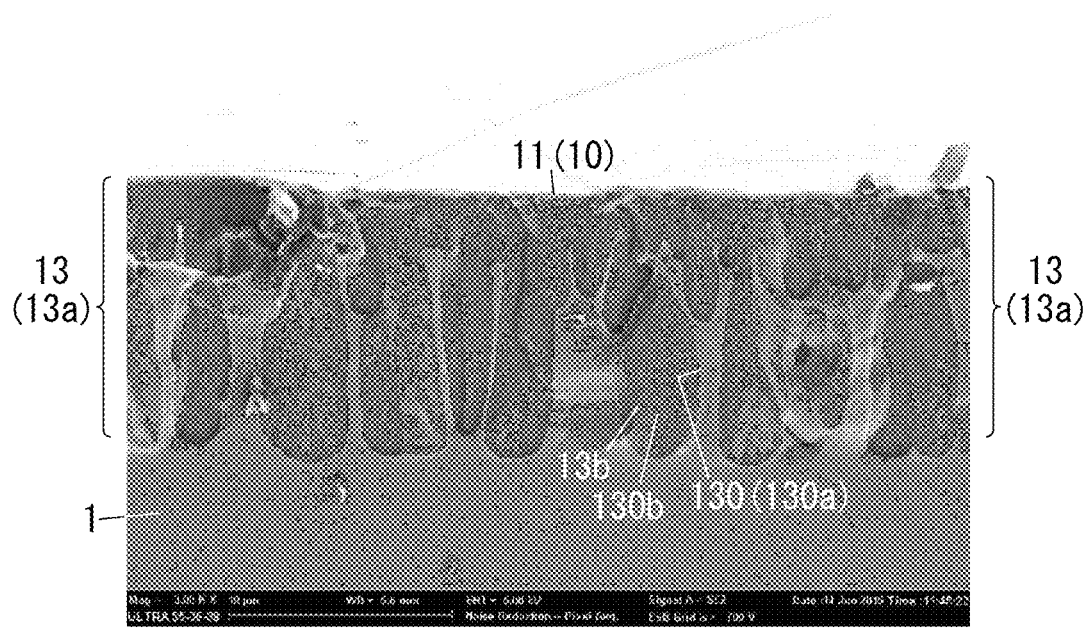
FIG. 7A is a photograph (magnification: 3000) obtained by capturing an image of the main part of the silicon substrate by a scanning electron microscope (SEM) after the anode oxidation process.

In the method for producing the capacitor 100 of the first embodiment described above, another porous part 13b (which is, so to speak, nanoporous) may be in the fine pores 130 of a porous part 13 (which is, so to speak, macroporous) as shown in FIGS. 6A and 7A after the anode oxidation process. In the second embodiment, the another porous part 13b is removed from the fine pores 130. That is, the method for producing of the capacitor 100 of the second embodiment is different from the method for producing the capacitor 100 of the first embodiment in that a removal step of removing the porous part 13b is further included.

According to the second embodiment, removing the porous part 13b from the fine pores 130 makes formation of a dielectric layer 3 in the fine pores 130 (see FIG. 6D) easy. Note that FIGS. 6A to 6D are schematic views to facilitate the understanding of the description.

(2) Details

The method for producing of the capacitor 100 of the second embodiment will be described in detail below with reference to the drawings.

In the second embodiment, the porous part 13 and the fine pores 130 of the first embodiment are respectively referred to as a first porous part 13a and first fine pores 130a.

As shown in FIG. 6A, the first porous part 13a is, so to speak, macroporous. The first porous part 13a has the plurality of first fine pores 130a. The plurality of first fine pores 130a extend from a plurality of locations in a capacitance generation region 11 along a direction transverse to a principal surface 10 (in the present embodiment, a thickness direction of a silicon substrate 1). That is, each first fine pore 130a is a longitudinally elongated pore.

The average value of the lengths (lengths along the thickness direction of the silicon substrate 1 of the first fine pores 130a) is not particularly limited but is preferably, for example, greater than or equal to 30 μm and less than or equal to 50 μm. The average value of pore diameters (pore diameters in a surface orthogonal to the thickness direction of the silicon substrate 1) of the first fine pores 130a is not particularly limited but is, for example, greater than or equal to 100 nm and less than or equal to 5 μm. As described above, the first porous part 13a has a plurality of micrometer-order first fine pores 130a and is thus macroporous.

In contrast, the second porous part 13b is, so to speak, nanoporous. The second porous part 13b has a plurality of second fine pores 130b. The second fine pores 130b are randomly oriented. The pore diameter of each second fine pore 130b is slightly smaller than the pore diameter of each first fine pore 130a. Specifically, the average value of the pore diameters of the second fine pores 130b is not particularly limited but is, for example, greater than or equal to 30 nm and less than or equal to 500 nm. The pore diameter of each second fine pore 130b is measurable by a publicly known means such as SEM image observation. As described above, the second porous part 13b has the plurality of nanometer-order second fine pores 130b and is thus nanoporous.

As shown in FIGS. 6A and 7A, in the method for producing the capacitor 100 of the first embodiment, the second porous part 13b may be in the first fine pores 130a of the first porous part 13a after the anode oxidation process. That is, in the plurality of first fine pores 130a, respective second porous parts 13b may exist. Each of the second porous parts 13b has the plurality of second fine pores 130b slightly smaller than the first fine pores 130a. The entire shape of each second porous part 13b is substantially the same as the shape of the first fine pore 130a in which the second porous part 13b exists.

The method for producing the capacitor 100 of the second embodiment further includes a removal step of removing at least part of the second porous part 13b in the first fine pores 130a. In FIG. 6C, the entirety of the second porous part 13b in the first fine pores 130a is removed. For example, part of the second porous part 13b may remain on a bottom of each first fine pore 130a.

As described above, removing the second porous part 13b from the first fine pore 130a makes formation of the dielectric layer 3 in the first fine pores 130a as shown in FIG. 6D easy. In FIG. 6D, the dielectric layer 3 is shown as an ONO film (a first silicon oxide film 31/a nitride film 33/a second silicon oxide film 32) but is not limited to this example.

Moreover, as shown in FIG. 6D, a hollow part 134 still remains even after the dielectric layer 3 is formed in the first fine pores 130a, and therefore, the hollow part 134 is easily filled with a filling part 22. The filling part 22 has a conductive property. This can increase the electrostatic capacitance of the capacitor 100.

Here, a means for removing the second porous part 13b from each of the first fine pores 130a is not particularly limited. A first removable means and a second removable means are described as specific examples below.

The first removable means is a means of utilizing a difference in reaction speed with an etching solution (an etchant). The first porous part 13a and the second porous part 13b are different from each other in terms of the surface area. The surface area of the second porous part 13b is larger than that of the first porous part 13a. Thus, the second porous part 13b is more likely to be removed by the etching solution than the first porous part 13a. The etching solution is not particularly limited, but examples of the etching solution include a tetramethylammonium hydroxide (TMAH) aqueous solution, hydrofluoric acid, and a potassium hydroxide (KOH) aqueous solution.

Figure 7B:
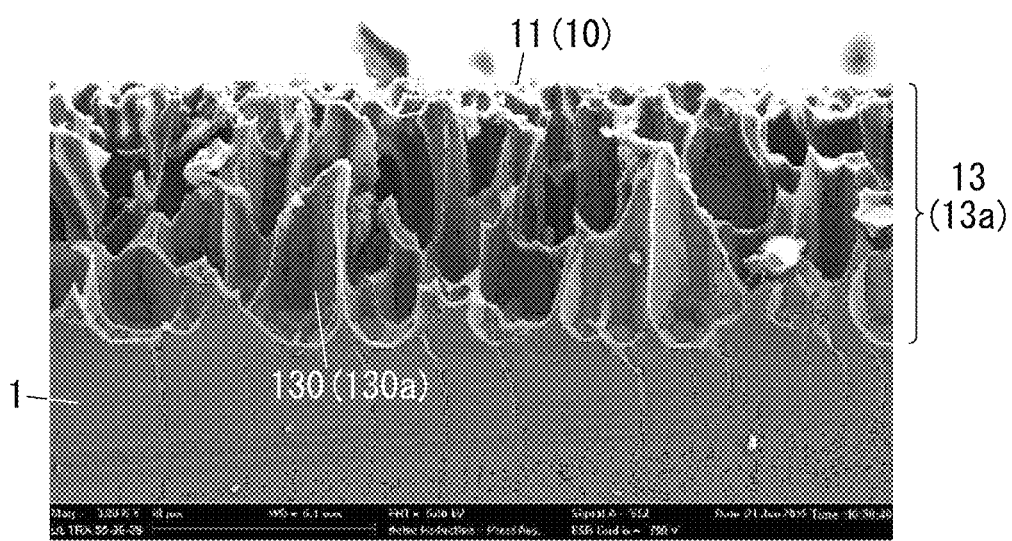
FIG. 7B is a photograph (magnification: 3000) obtained by capturing an image of the main part of the silicon substrate by the SEM after second porous part removal.

FIG. 7A is a photograph obtained by capturing, by SEM, an image of a main part of the silicon substrate 1 after the anode oxidation process (corresponding to FIG. 6A). As can be clearly seen from this photograph, it is confirmed that the first fine pores 130a of the first porous part 13a are filled with the second porous part 13b. A photograph after the second porous part 13b is removed from the first fine pores 130a by using TMAH as the etching solution is shown in FIG. 7B (corresponding to FIG. 6C).

In contrast, the second removable means is, as shown in FIGS. 6B and 6C, a means of removing the second porous part 13b after the second porous part 13b is made into an oxide 15. That is, the removal step includes a step of oxidizing the second porous part 13b to obtain the oxide 15 (oxidation step) and a step of removing the oxide 15 by etching (oxide removal step).

In the oxidation step, the thermal oxidation process is performed. The condition of the thermal oxidation process is, for example, that the heating temperature is higher than or equal to 1000° C. and lower than or equal to 1200° C. in an oxygen atmosphere. A heating time is about 60 minutes.

As described above, the second porous part 13b has a larger surface area than the first porous part 13a. Thus, the second porous part 13b has an area which is in contact with oxygen and which is larger than that of the first porous part 13a, and therefore, the second porous part 13b is more likely to be oxidized. That is, oxygen enters the second fine pores 130b of the second porous part 13b and chemically changes the second porous part 13b into the oxide 15 (specifically oxide silicon). In contrast, the first porous part 13a is hardly oxidized and remains as non-oxide (specifically silicon).

In the oxide removal step, an etching solution showing higher selectivity to the oxide 15 than to the non-oxide is used to selectively remove the oxide 15 by the etching solution (see FIG. 6C). The etching solution is not particularly limited, but examples of the etching solution include hydrofluoric acid. The hydrofluoric acid is an aqueous solution of hydrogen fluoride and is generally called hydrofluoric acid.

As described above, in the second removable means, the second porous part 13b is changed into the oxide 15, and thereby, the second porous part 13b is easily removed from the first fine pores 130a as shown in FIG. 6C.

Then, removing the second porous part 13b from the first fine pore 130a makes formation of the dielectric layer 3 in the first fine pores 130a as shown in FIG. 6D easy. Moreover, as shown in FIG. 6D, a hollow part 134 still remains even after the dielectric layer 3 is formed in the first fine pores 130a, and therefore, the hollow part 134 is easily filled with a filling part 22. This can increase the electrostatic capacitance of the capacitor 100.

3. Variation

The configuration of the capacitor 100 and the method for producing the capacitor 100 are not particularly limited to the embodiments described above.

For example, the capacitor 100 shown in FIGS. 1A and 1B has the porous part 13 the entirety of which is constituted by the fine pores 130, but this should not be construed as limiting.

Figure 8A:
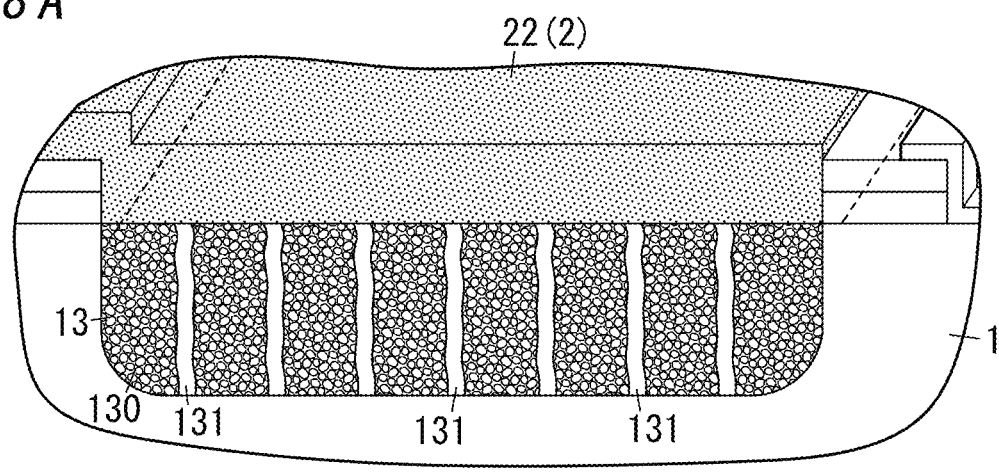
FIG. 8A is a perspective view schematically illustrating a variation of the capacitor of FIG. 1A.

For example, as shown in FIG. 8A, a porous part 13 may partially have non-porous portions 131 having no fine pore 130. Since the non-porous portions 131 have no fine pore 130, the non-porous portions 131 are not filled with a conductor layer 2 (a filling part 22). Thus, providing the non-porous portions 131 can suppress the porous part 13 from being damaged by stress when the conductor layer 2 (the filling part 22) is formed in the fine pores 130. That is, the non-porous portions 131 can improve the strength of the porous part 13.

Figure 8B:
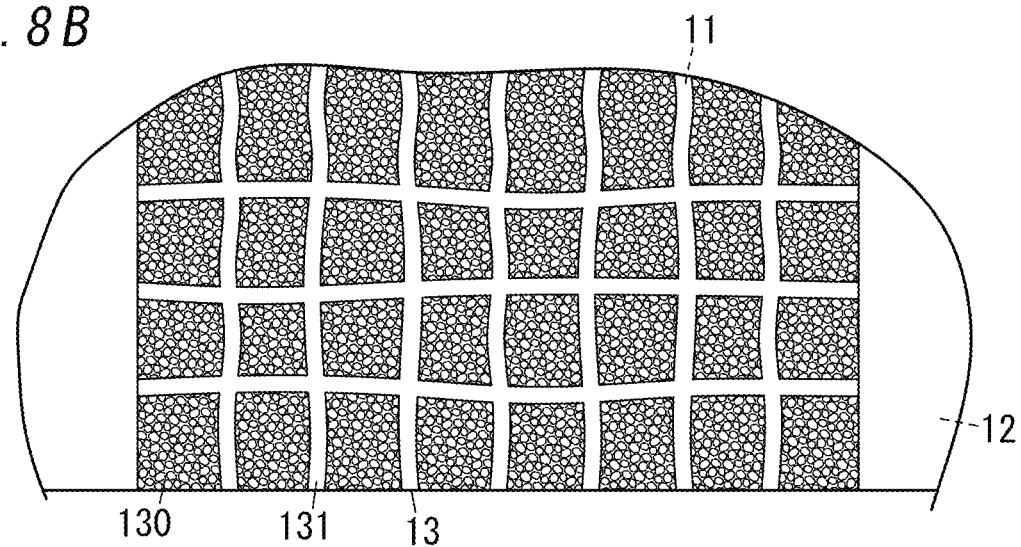
FIG. 8B is an enlarged view illustrating a main part of a porous part of the capacitor of FIG. 8A.

The shape of the non-porous portions 131 is not particularly limited, but as shown in FIGS. 8A and 8B, the non-porous portions 131 may, for example, divide a capacitance generation region 11 into a plurality of portions in plan view. For example, when the non-porous portions 131 each have a wall shape configured to divide the porous part 13 into a plurality of portions, the non-porous portions 131 can divide the capacitance generation region 11 into a plurality of portions in plan view. Such non-porous portions 131 can also improve the strength of the porous part 13. Moreover, the portions obtained by dividing the porous part 13 function as respective capacitors and connecting the capacitors parallel to each other can reduce the equivalent series resistance (ESR) of the capacitor 100. Moreover, the non-porous portions 131 shown in FIGS. 8A and 8B each have a wall shape, but each of the non-porous portions 131 may have, for example, a columnar shape.

Figure 9:
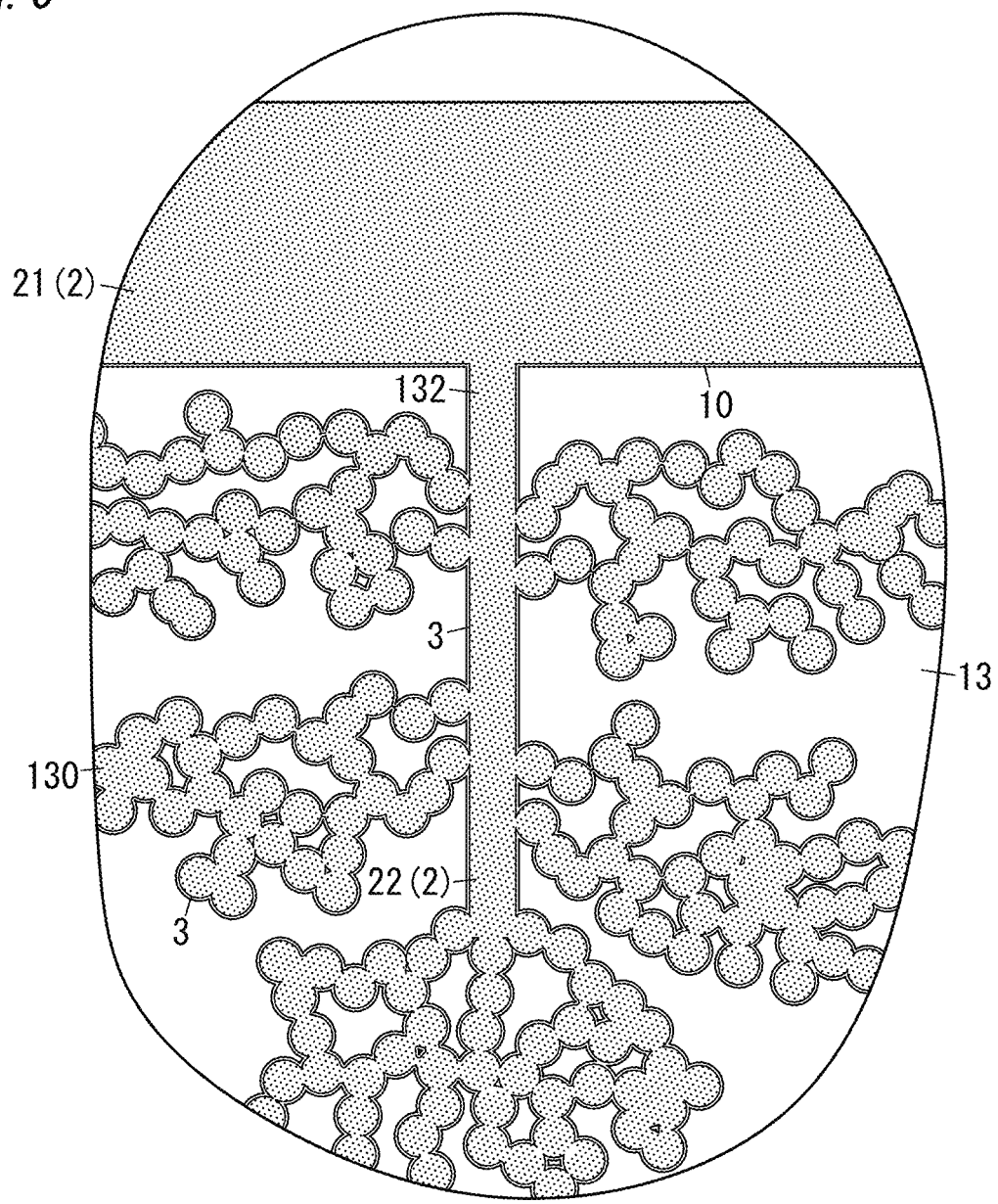
FIG. 9 is an enlarged sectional view illustrating the main part of the porous part of the variation of the capacitor of FIG. 1A.

For example, the porous part 13 may have at least one of a non-through hole or a groove having an opening at the side of the first principal surface 10. The non-through hole and the groove have no fine pore 130, and the non-through hole and the groove are filled with the conductor layer 2 (the filling part 22). Moreover, a dielectric layer 3 is formed on inner surfaces of the non-through hole and the groove, and therefore, the dielectric layer 3 is provided between each of the inner surfaces of the non-through hole and the groove and the conductor layer 2 (the filling part 22). The porous part 13 having at least one of the non-through hole or the groove allows gas to easily enter the fine pores 130, and therefore, the fine pores 130 are easily filled with the conductor layer 2 (the filling part 22) by CVD. The non-through hole or the groove can be formed by, for example, dry etching the capacitance generation region 11 of the silicon substrate 1. The non-through hole and the groove may be formed before the porous part 13 is formed in the silicon substrate 1 or may be formed after the porous part 13 is formed in the silicon substrate 1. For example, the porous part 13 shown in FIG. 9 has a trench 132 as the non-through hole or the groove opening at the side of the first principal surface 10. The trench 132 is filled with the conductor layer 2 (the filling part 22). The porous part 13 may have one trench 132 but preferably has a plurality of trenches 132. Note that the trench 132 shown in FIG. 9 is schematically shown, and the ratio of the dimension of the fine pores 130 to the dimension of the trench 132 is not limited to the ratio shown in FIG. 9.

Naturally, the porous part 13 may have both the non-porous portions 131 described above and at least one of the non-through hole or the groove opening at the side of the first principal surface 10.

Figure 10:
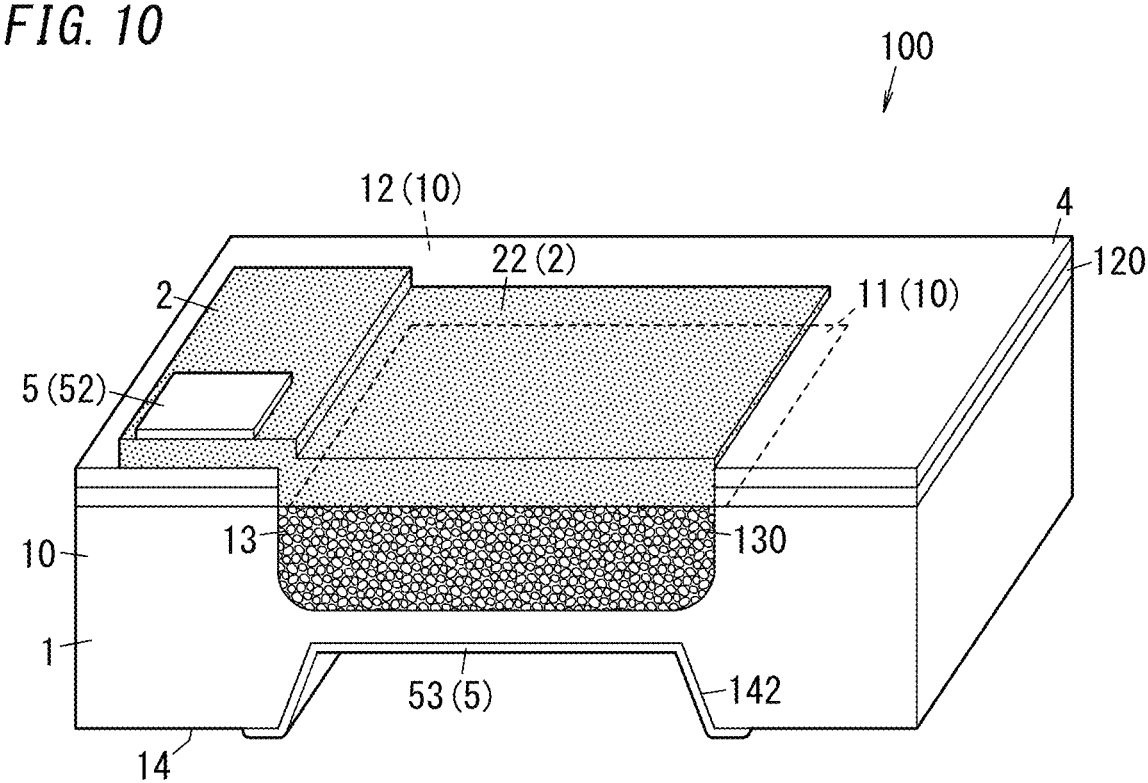
FIG. 10 is a perspective view schematically illustrating a variation of the capacitor of FIG. 1A.

For example, in the capacitor 100 shown in FIGS. 1A and 1B, a through hole is formed in the inorganic insulating layer 4 on the non-capacitance generation region 12, and the silicon substrate 1 exposed in the through hole and the first contact terminal 51 are electrically connected to each other, but this should not be construed as limiting. For example, as shown in FIG. 10, the silicon substrate 1 has a second principal surface 14 located on an opposite side from the first principal surface 10, the second principal surface 14 has a region underlying the capacitance generation region 11 in the thickness direction of the silicon substrate 1, and the region has a cavity 142 depressed toward the first principal surface 10. A contact terminal 5 made of metal (a third contact terminal 53) in place of the first contact terminal 51 is formed on a surface of the cavity 142, and thereby, the distance between a first electrode (the third contact terminal 53) and a second electrode (a second contact terminal 52) can be shorter than that of the capacitor 100 shown in FIGS. 1A and 1B.

For example, in the capacitor 100 shown in FIGS. 1A and 1B, the inorganic insulating layer 4 including silicon nitride is provided on the non-capacitance generation region 12, and between the conductor layer 2 above the non-capacitance generation region 12 and the silicon substrate 1, the inorganic insulating layer 4 is disposed, but this should not be construed as limiting. For example, the capacitor 100 does not have to include the inorganic insulating layer 4. For example, to produce the capacitor 100, metal such as chrome or gold or an organic resin is preferably used as the masking layer 40, and the masking layer 40 is preferably removed after the anode oxidation process (after the porous part 13 is formed) and before the conductor layer 2 is formed. The linear expansivity difference of the metal such as chrome or gold and the organic resin from the silicon substrate 1 is greater than the linear expansivity difference of silicon nitride from the silicon substrate 1. Therefore, when the masking layer 40 made of metal such as chrome or gold or an organic resin is not included in the capacitor 100, the occurrence of a warp due to the linear expansivity difference between the masking layer 40 and the silicon substrate 1 can be suppressed.

4. Aspects

As can be seen from the embodiments described above, the present disclosure includes the following aspects. Note that reference signs in parentheses are added only to clarify the correspondence relationship to the embodiments in the following description.

A capacitor (100) of a first aspect includes a silicon substrate (1), a conductor layer (2), and a dielectric layer (3). The silicon substrate (1) has a principal surface (10) including a capacitance generation region (11) and a non-capacitance generation region (12), and the silicon substrate (1) has a porous part (13) provided in a thickness direction in the capacitance generation region (11). The conductor layer (2) has a surface layer part (21) at least covering part of a surface (110) of the capacitance generation region (11) and a filling part (22) filled in at least part of fine pores (130) of the porous part (13). The dielectric layer (3) is provided between an inner surface of the fine pores (130) and the filling part (22).

In this case, the porous part (13) provided in the thickness direction in the capacitance generation region (11) in the principal surface (10) of the silicon substrate (1) and the filling part (22) filled in the porous part (13) easily secure the surface area of an electrode, which increases the electrostatic capacitance of the capacitor (100). Moreover, the porous part (13) is formed in the capacitance generation region (11), and therefore, the strength of the silicon substrate (1) is suppressed from being reduced as compared to the case where the entirety of the principal surface (10) is made porous.

A capacitor (100) of a second aspect referring to the first aspect further includes an inorganic insulating layer (4) provided on the non-capacitance generation region (12).

In this case, the insulation property of the silicon substrate (1) is secured at a portion provided with the inorganic insulating layer (4).

In a capacitor (100) according to a third aspect referring to the second aspect, the inorganic insulating layer (4) includes at least silicon nitride.

In this case, the linear expansivity difference between the inorganic insulating layer (4) and the silicon substrate (1) is reduced.

In a capacitor (100) of a fourth aspect referring to any one of the first to third aspects, the porous part (13) partially has a non-porous portion (131) having no fine pore (130).

In this case, the strength of the porous part (13) is improved, and the porous part (13) is suppressed from being damaged by stress at the time of filling the fine pores (130) with the conductor layer (2).

In a capacitor (100) of a fifth aspect referring to the fourth aspect, the non-porous portion (131) divides the capacitance generation region (11) into a plurality of portions in plan view.

In this case, the strength of the porous part (13) is improved, and the porous part (13) is suppressed from being damaged by stress at the time of filling the fine pores (130) with the conductor layer (2).

A capacitor (100) of a sixth aspect referring to any one of the first to fifth aspects, the porous part (13) has a surface area 200 or more times an area of the capacitance generation region (11).

In this case, the electrostatic capacitance of the capacitor (100) is increased.

In a capacitor (100) of a seventh aspect referring to any one of the first to sixth aspects, the silicon substrate (1) has a second principal surface (14) located on an opposite side from the first principal surface (10), the second principal surface (14) has a region underlying the capacitance generation region (11) in the thickness direction of the silicon substrate (1), and the region has a cavity (142) depressed toward the first principal surface (10).

In this case, an interelectrode distance between the silicon substrate (1) constituting a first electrode and the conductor layer (2) constituting a second electrode is reduced.

In a capacitor (100) of an eighth aspect referring to any one of the first to seventh aspects, the conductor layer (2) includes at least one kind of element selected from the group consisting of polysilicon, platinum, and ruthenium.

In this case, the conductive property of the conductor layer (2) is improved.

In a capacitor (100) of a ninth aspect referring to any one of the first to eighth aspects, the porous part (13) has at least one of a non-through hole or a groove opening at a side of the principal surface (10).

In this case, the fine pores (130) of the porous part (13) are easily filled with the conductor layer (2) (the filling part (22)).

In a capacitor (100) of a tenth aspect referring to any one of the first to ninth aspects, part of the porous part (13) is exposed at a side of a second principal surface (14) located on an opposite side of the silicon substrate (1) from the principal surface (10).

In this case, a maximum value of the thickness of the porous part (13) is equal to the thickness of the silicon substrate (1).

In a capacitor (100) of an eleventh aspect referring to any one of the first to tenth aspects, part of the porous part (13) extends into a portion underlying the non-capacitance generation region (12) of the silicon substrate (1) in the thickness direction.

In this case, the volume of the porous part (13) increases, and therefore, the surface areas of the inner surfaces of the fine pores (130) is increased, which increases the electrostatic capacitance of the capacitor (100).

In a capacitor (100) of a twelfth aspect referring to any one of the first to eleventh aspects, the fine pores (130) extends from a plurality of locations in the capacitance generation region (11) along a direction transverse to the principal surface (10).

In this case, the surface areas of the inner surfaces of the fine pores (130) included in the porous part (13) is increased, which increases the electrostatic capacitance of the capacitor (100).

A method for producing a capacitor (100) of a thirteenth aspect includes a masking step, a porous part forming step, a dielectric layer forming step, and a conductor layer forming step. The masking step includes providing a masking layer (40) on a non-capacitance generation region (12) of a silicon substrate (1) having a principal surface (10) including a capacitance generation region (11) and the non-capacitance generation region (12). The fine pore forming step includes, by an anode oxidation process, forming a porous part (13) in the capacitance generation region (11) in a thickness direction of the silicon substrate (1) by forming fine pores (130) in the capacitance generation region (11) which is not covered with the masking layer (40). The porous part forming step includes forming a dielectric layer (3) on an inner surface of the fine pores (130). The conductor layer forming step includes forming the conductor layer including a filling part (22) filled in at least part of the fine pores (130) and a surface layer part at least covering part of a surface (110) of the capacitance generation region (11).

In this case, the non-capacitance generation region (12) is protected by the masking layer (40) when the anode oxidation process is performed in the porous part forming step, and thus, the non-capacitance generation region (12) is suppressed from being damaged or changed in property due to mixed liquid.

In a method for producing a capacitor (100) of a fourteenth aspect referring to the thirteenth aspect, the porous part (13) is a first porous part (13a), the fine pores (130) are first fine pores (130a), and the method further includes a removal step of removing at least part of a second porous part (13b) from the first fine pores (130a).

In this case, removing the second porous part (13b) from the first fine pores (130a) makes formation of the dielectric layer (3) and the filling part (22) in the first fine pores (130a) easy.

In a method for producing a capacitor (100) of a fifteenth aspect referring to the fourteenth aspect, the removal step includes a step of oxidizing the second porous part (13b) to obtain oxide (15) and a step of removing the oxide (15) by etching.

In this case, oxidizing the second porous part (13b) enables the second porous part (13b) to be easily removed from the first fine pores (130a).

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A capacitor, comprising:
   a silicon substrate having a principal surface including a capacitance generation region and a non-capacitance generation region, the silicon substrate having a porous part provided in a thickness direction in the capacitance generation region;
   a conductor layer having a surface layer part at least covering part of a surface of the capacitance generation region and a filling part filled in at least part of fine pores of the porous part;

a dielectric layer provided between an inner surface of the fine pores and the filling part, and an oxidized coating on the non-capacitance generation region.

2. The capacitor of claim 1, further comprising an inorganic insulating layer provided on the non-capacitance generation region.

3. The capacitor of claim 2, wherein the inorganic insulating layer includes at least silicon nitride.

4. The capacitor of claim 1, wherein the porous part partially has a non-porous portion having no fine pore.

5. The capacitor of claim 4, wherein the non-porous portion divides the capacitance generation region into a plurality of portions in plan view.

6. The capacitor of claim 1, wherein the porous part has a surface area 200 or more times an area of the capacitance generation region.

7. The capacitor of claim 1, wherein the silicon substrate has a second principal surface located on an opposite side from the principal surface, the second principal surface having a region underlying the capacitance generation region in the thickness direction of the silicon substrate, the region having a cavity depressed toward the principal surface.

8. The capacitor of claim 1, wherein the conductor layer includes at least one kind of element selected from the group consisting of polysilicon, platinum, and ruthenium.

9. The capacitor of claim 1, wherein the porous part has at least one of a non-through hole or a groove opening at a side of the principal surface.

10. The capacitor of claim 1, wherein part of the porous part is exposed at a side of a second principal surface located on an opposite side of the silicon substrate from the principal surface.

11. The capacitor of claim 1, wherein part of the porous part extends into a portion underlying the non-capacitance generation region of the silicon substrate in the thickness direction.

12. The capacitor of claim 1, wherein the fine pores extend from a plurality of locations in the capacitance generation region along a direction transverse to the principal surface.

13. The capacitor of claim 1, wherein the oxidized coating is made of oxidized silicon.

14. A method for producing a capacitor, the method comprising:
a step of providing an oxidized coating and a masking layer stacked in this order on a non-capacitance generation region of a silicon substrate having a principal surface including a capacitance generation region and the non-capacitance generation region;
a step of forming, by an anode oxidation process, a porous part in the capacitance generation region in a thickness direction of the silicon substrate by forming fine pores in the capacitance generation region which is not covered with the masking layer;
a step of forming a dielectric layer on an inner surface of the fine pores; and
a step of forming a conductor layer including a filling part filled in at least part of the fine pores and a surface layer part at least covering part of a surface of the capacitance generation region.

15. The method of claim 14, wherein
the porous part is a first porous part,
the fine pores are first fine pores, and
the method further includes a removal step of removing at least part of a second porous part from the first fine pores.

16. The method of claim 15, wherein the removal step includes a step of oxidizing the second porous part to obtain oxide and a step of removing the oxide by etching.

* * * * *